United States Patent
Fong

(10) Patent No.: US 9,933,310 B2
(45) Date of Patent: *Apr. 3, 2018

(54) GRAPHENE-BASED INFRARED BOLOMETER

(71) Applicant: RAYTHEON BBN TECHNOLOGIES CORP., Cambridge, MA (US)

(72) Inventor: Kin Chung Fong, Lexington, MA (US)

(73) Assignee: RAYTHEON BBN TECHNOLOGIES CORP., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/794,591

(22) Filed: Jul. 8, 2015

(65) Prior Publication Data

US 2016/0370232 A1 Dec. 22, 2016

Related U.S. Application Data

(60) Provisional application No. 62/181,177, filed on Jun. 17, 2015.

(51) Int. Cl.
*G01J 5/20* (2006.01)
*G01J 5/08* (2006.01)
(Continued)

(52) U.S. Cl.
CPC ............... *G01J 5/0818* (2013.01); *G01J 1/42* (2013.01); *G01J 1/44* (2013.01); *G01J 5/20* (2013.01);
(Continued)

(58) Field of Classification Search
CPC .................................. G01J 5/0818; G01J 5/20
See application file for complete search history.

(56) References Cited

U.S. PATENT DOCUMENTS

| 5,155,093 A | 10/1992 | Den et al. |
| 7,723,684 B1 * | 5/2010 | Haddon .................... G01J 5/02 250/338.1 |

(Continued)

FOREIGN PATENT DOCUMENTS

JP 2004-286715 A 10/2004

OTHER PUBLICATIONS

Gan et al. "Chip-Integrated Ultrafast Graphene Photodetector with High Responsivity", Nature Photonics, Published Online: Sep. 15, 2013.*

(Continued)

*Primary Examiner* — Casey Bryant
(74) *Attorney, Agent, or Firm* — Lewis Roca Rothgerber Christie LLP

(57) ABSTRACT

An infrared bolometer. In one embodiment a waveguide configured to transmit infrared radiation is arranged to be adjacent a graphene sheet and configured so that evanescent waves from the waveguide overlap the graphene sheet. The graphene sheet has two contacts connected to an amplifier, and a power detector connected to the amplifier. Infrared electromagnetic power in the evanescent waves is absorbed in the graphene sheet, heating the graphene sheet. The power of Johnson noise generated at the contacts is proportional to the temperature of the graphene sheet. The Johnson noise is amplified and the power in the Johnson noise is used as a measure of the temperature of the graphene sheet, and of the amount of infrared power propagating in the waveguide.

20 Claims, 11 Drawing Sheets

(51) Int. Cl.
G01J 1/42 (2006.01)
G01J 1/44 (2006.01)
H01L 29/16 (2006.01)
G01J 5/10 (2006.01)

(52) U.S. Cl.
CPC ..... *G01J 2005/106* (2013.01); *H01L 29/1606* (2013.01)

(56) References Cited

U.S. PATENT DOCUMENTS

| | | | | |
|---|---|---|---|---|
| 8,436,305 | B1* | 5/2013 | Sood | G01J 5/023 250/338.1 |
| 8,916,825 | B1* | 12/2014 | Egerton | G01J 5/046 250/338.4 |
| 9,105,793 | B2 | 8/2015 | Bouchiat et al. | |
| 9,196,766 | B1* | 11/2015 | Egerton | G01J 5/20 |
| 2008/0251723 | A1* | 10/2008 | Ward | G01J 5/02 250/338.4 |
| 2009/0233798 | A1 | 9/2009 | Maeda et al. | |
| 2011/0042650 | A1 | 2/2011 | Avouris et al. | |
| 2013/0105795 | A1 | 5/2013 | Kim et al. | |
| 2013/0342279 | A1 | 12/2013 | Sensale-Rodriguez et al. | |
| 2014/0056551 | A1 | 2/2014 | Liu et al. | |
| 2014/0103213 | A1* | 4/2014 | Maliakal | G02B 6/10 250/343 |
| 2015/0109606 | A1* | 4/2015 | Peale | H01L 31/1136 356/30 |
| 2015/0372159 | A1 | 12/2015 | Englund et al. | |
| 2016/0370232 | A1 | 12/2016 | Fong | |
| 2016/0372622 | A1 | 12/2016 | Fong | |

OTHER PUBLICATIONS

Karasik et al. "Monolayer graphene bolometer as a sensitive far-IR detector," Proc. SPIE 9153, Millimeter, Submillimeter, and Far-Infrared Detectors and Instrumentation for Astronomy VII, 915309 (Jul. 23, 2014).*
Koppens et al. "Photodetectors based on graphene, other two-dimensional materials and hybrid systems." Nature Nanotechnology | vol. 9 | Oct. 2014.*
Gan et al. "Chip-integrated ultrafast graphene photodetector with high responsivity," Nature Photonics: published Online: Sep. 15, 2013.*
Liu et al. "A Graphene-based Broadband Optical Modulator", 64 Nature, vol. 474, published Jun. 2, 2011.*
Avouris, at al., "Graphene Photonics, Plasmonics; and Optoelectronics", IEEE Journal of Selected Topics in Quantum Electronics, vol. 20, No. 1, Jan. 1, 2014, p. 6000112 (12 pgs.).
Gan, et al., "Chip-integrated Ultrafast Graphene Photodetector With High Responsivity", Nature Photonics, vol. 7, No. 11, Sep. 15, 2013 (pp. 883-887).
Karasik, et al., "Monolayer Graphene Bolometer as a Sensitive Far-IR Detector", Optomechatronic Micro/Nano Devices and Components III : Oct. 8-10, 2007, vol. 9153, Jul. 23, 2014, (pp. 915309-1-915309-9).
Invitation to Pay Additional Fees in related International Patent Application No. PCT/US2016/016436, filed Feb. 3, 2016, Invitation to Pay Additional Fees mailed May 6, 2016 (7 pgs.).
Bozzi et al., "Current and Future Research Trends in Substrate Integrated Waveguide Technology," Radioengineering, 18(2):201-209, Jun. 2009.
Castellanos-Beltran et al., "Widely tunable parametric amplifier based on a superconducting quantum interference device array resonator," Applied Physics Letters, 91, 083509, 3 pages, 2007.
CITLF3, Cryogenic SiGe Low Noise Amplifier, 4 pages, Mar. 11, 2014.
CITCRY04-12A, Cryogenic HEMT Low Noise Amplifier, 3 pages, Oct. 13, 2010.
Crossno et al., "Development of high frequency and wide bandwidth Johnson noise thermometry," Applied Physics Letters, 106, 023121, 4 pages, 2015.
Eom et al., "A wideband, low-noise superconducting amplifier with high dynamic range," Nature Physics, 8:623-627, Aug. 2012.
Fong et al., "Measurement of the Electronic Thermal Conductance Channels and Heat Capacity of Graphene at Low Temperature," Physical Review X, 3, 041009, 7 pages, 2013.
Fong et al., "Measurement of the Electronic Thermal Conductance Channels and Heat Capacity of Graphene at Low Temperature," Applied Physics, California Institute of Technology, 7 pages, 2013.
Fong et al., "Ultrasensitive and Wide-Bandwidth Thermal Measurements of Graphene at Low Temperatures," Physical Review X, 2, 031006, 8 pages, 2012.
Fong et al., "Ultrasensitive and Wide-Bandwidth Thermal Measurements of Graphene at Low Temperatures," Applied Physics, California Institute of Technology, 18 pages, Jul. 24, 2012.
Karasik et al., "Normal-Metal Hot-Electron Nanobolometer With Johnson Noise Thermometry Readout," IEEE Trans. on Terahertz Sci. and Tech., 6 pages, 2014.
Lee et al., "Fabrication of ultralow-loss $Si/SiO_2$ waveguides by roughness reduction," Optics Letters, 26(23):1888-1890, Dec. 1, 2001.
McKitterick et al., "Performance of graphene thermal photon detectors," Journal of Applied Physics, 113, 044512, 6 pages, 2013.
Mück et al., "Superconducting quantum interference device as a near-quantum-limited amplifier at 0.5 Ghz," Applied Physics Letters, 78(7):967-969, Feb. 12, 2001.
Soltani, "Novel Integrated Silicon Nanophotonics Structures using Ultra-high Q Resonators," School of Electrical and Computer Engineering, Georgia Institute of Technology, 425 pages, Dec. 2009.
Wang et al., "One-Dimensional Electrical Contact to a Two-Dimensional Material," 342:614-617, Nov. 1, 2013.
Yan et al., "Dual-gated bilayer graphene hot-electron bolometer," Nature Nanotechnology, 7:472-478, Jul. 2012.
Vicarelli, et al., "Graphene Field-Effect Transistors as Room-Temperature Terahertz Detectors", Nature Materials, Advance Online Publication: Published Sep. 9, 2012 (pp. 1-7).
Walsh, et al., "Detecting Single Photons by Graphene-Based Josephson Junctions", Department of Electrical Engineering and Computer Science, Massachusetts Institute of Technology, Cambridge, MA, Dated Mar. 8, 2016 (10 pgs.).
International Search Report from related International Application No. PCT/US2016/016436, International Search Report dated Apr. 28, 2016 and dated Jul. 11, 2016 (6 pgs.).
Written Opinion of the International Seaiching Authority from related International Application No. PCT/US2016/016436, dated Jul. 11, 2016 (9 pgs.).
Du, et al., "Graphene-based Bolometers) Graphene and 2D Materials, Aug. 1, 2013 URL:https://arxiv.org/ftp/arxiv/papers/1308/1308.4065.pdf (50 pgs.).
Koester, et at, "Waveguide-Coupled Graphene Optoelectronics" IEEE Journal of Selected Topics in Quantum Electronics, vol. 20, No. 1, Jan./Feb. 2014 (11 pgs).
McKitterick, et al., "Performance of Graphene Thermal Photon Detectors" Journal of Applied Physics vol. 113, No. 4 Jan. 28, 2013 (pp. 044512-1 to 044512-6).
International Searth Report from related International Application No. PCT/US2016/027946, International Search Report dated Jul. 15, 2016 and dated Oct. 10, 2016 (5 pgs.).
Written Opinion of the International Searching Authority Application No. PCT/US2016/027946, dated Oct. 10, 2016 (7 pgs.).
Invitation to Pay Additional Fees in corresponding International Patent Application No. PCT/US2015/028622, filed Apr. 20, 2016, Invitation to Pay Additional Fees dated Oct. 21, 2016 (6 pgs.).
McKitterick, et at "Ultrasensitive graphene far-infrared power detectors", Journal of Physics: Condensed Matter, Institute of Physics Publishing, Bristol, GB, vol. 27, No. 16, Apr. 2, 2016 (13 pgs.).
Du, et al. "Graphene-based Boiometers", Graphene and 2D Materials, vol. 1, No. 1, Jan. 1, 2014. pp. 1-22.

(56) References Cited

OTHER PUBLICATIONS

Liu, et al. "A graphene-based broadband optical modulator", Jun. 2, 2011, Nature, vol. 474, pp. 64-67.
Xia et al., "Ultrafast graphene photodetector", Dec. 2009, Nature Nanotechnology, vol. 4, pp. 839-843.
Xu et al., "Photo-Thermoelectric Effect at a Graphene interface Junction", Nov. 10, 2009, American Chemical Society, vol. 10, pp. 562-566.
International Search Report from related International Application No. PCT/US2016/028522, International Search Report dated Oct. 13, 2016 and dated Dec. 15, 2016 (7 pgs.).
Written Opinion of the International Searching Authority from related International Application No. PCT/US2016/028522, dated Dec. 15, 2016 (9 pgs.).

\* cited by examiner

GRAPHENE-BASED INFRARED BOLOMETER

CROSS-REFERENCE TO RELATED APPLICATION(S)

The present application claims priority to and the benefit of U.S. Provisional Application No. 62/181,177, filed Jun. 17, 2015, entitled "GRAPHENE BASED INFRARED BOLOMETER", the entire content of which is incorporated herein by reference.

BACKGROUND

1. Field

One or more aspects of embodiments according to the present invention relate to detection of infrared light, and more particularly to a high-sensitivity, high-bandwidth bolometer for detecting infrared light.

2. Description of Related Art

Infrared bolometers have multiple applications, including applications in sensitive imaging systems and in communications systems. Constructing an infrared bolometer with good sensitivity for wavelengths in the range spanning from 10 microns to 1 micron may be challenging, in part because the thermal inertia of sensing elements of related art bolometers may be sufficient to impair their bandwidth and to reduce their sensitivity. Both bandwidth and sensitivity may be important for communications applications; such applications may use a wavelength of 1550 nm. Sensitivity may also be important for imaging applications, and bandwidth may be important for high-speed imaging. Thus, there is a need for a high-sensitivity, high-bandwidth infrared bolometer.

SUMMARY

Aspects of embodiments of the present disclosure are directed toward an infrared bolometer. In one embodiment a waveguide configured to transmit infrared radiation is arranged to be adjacent a graphene sheet and configured so that evanescent waves from the waveguide overlap the graphene sheet. The graphene sheet has two contacts connected to an amplifier, and a power detector connected to the amplifier. Infrared electromagnetic power in the evanescent waves is absorbed in the graphene sheet, heating the graphene sheet. The power of Johnson noise generated at the contacts is proportional to the temperature of the graphene sheet. The Johnson noise is amplified and the power in the Johnson noise is used as a measure of the temperature of the graphene sheet, and of the amount of infrared power propagating in the waveguide.

According to an embodiment of the present invention there is provided a infrared bolometer including: a waveguide configured to guide infrared electromagnetic waves, in a mode having an evanescent field extending outside of the waveguide; a graphene sheet having two contacts and configured: to be coupled to the evanescent field; to have a temperature, when electromagnetic power in the evanescent field is absorbed by the graphene sheet, corresponding to the amount of electromagnetic power absorbed by the graphene sheet; and to generate thermal noise at the two contacts at a level corresponding to the temperature; and a circuit connected to the two contacts, the circuit configured to measure the thermal noise level.

In one embodiment, the bolometer includes a refrigerator configured to cool the graphene sheet to a temperature below 4 K.

In one embodiment, the refrigerator is a pulse tube refrigerator.

In one embodiment, the refrigerator is a Gifford-McMahon cooler.

In one embodiment, the graphene sheet substantially has the shape of a rectangle, the rectangle having a length and a width, the length being greater than or equal to the width.

In one embodiment, the length of the rectangle is less than 20 microns.

In one embodiment, the product of the length of the rectangle and the width of the rectangle is less than 1000 square microns.

In one embodiment, the graphene sheet has an electron mobility of more than 100,000 $cm^2/V/s$.

In one embodiment, the waveguide has a curved section, the curved section having a radius of curvature less than the length of the rectangle, the curved section resulting in a change of direction of the waveguide of at least 45 degrees.

In one embodiment, the waveguide includes a reflector.

In one embodiment, the waveguide is on a substantially flat substrate, in a layer on a surface of the substrate, the layer having a thickness greater than 10 nanometers and less than 2 microns.

In one embodiment, the bolometer includes a first layer of hexagonal boron nitride immediately adjacent to a first surface of the graphene sheet, and a second layer of hexagonal boron nitride immediately adjacent to a second surface of the graphene sheet.

In one embodiment, each of the first layer of hexagonal boron nitride and the second layer of hexagonal boron nitride has a thickness greater than 4 nm and less than 40 nm.

In one embodiment, the circuit includes an amplifier connected to the two contacts.

In one embodiment, the bolometer includes a matching circuit connected between the two contacts and the amplifier.

In one embodiment, the bolometer includes a power detector connected to the amplifier.

In one embodiment, the graphene sheet consists of a single atomic layer of graphene.

In one embodiment, the graphene sheet includes two atomic layers of graphene.

In one embodiment, an infrared imaging system includes: an array of bolometers, each of the bolometers having an optical input, the optical inputs forming an array of optical inputs; and infrared imaging optics configured to project an image onto the array of optical inputs.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a graphene-based infrared bolometer provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
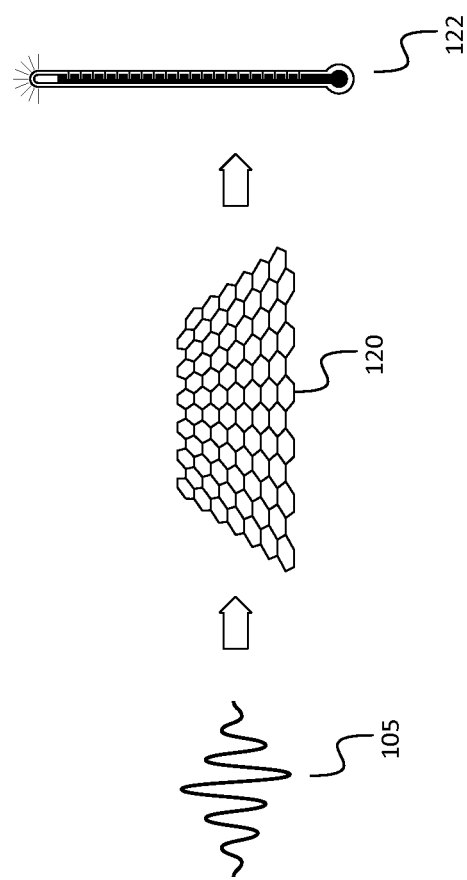
FIG. 1 is conceptual diagram illustrating the operation of an infrared bolometer, according to an embodiment of the present invention.

Referring to FIG. 1, in one embodiment, an infrared bolometer includes a graphene sheet 120, configured to absorb infrared electromagnetic waves 105. Electrons in the graphene sheet are weakly coupled to phonons in the graphene sheet, and the mechanisms by which heat escapes the electrons of the graphene sheet may provide heat paths with a relatively low total thermal conductivity. As a result, even for relatively little absorbed infrared electromagnetic power, the temperature of the electrons in the graphene sheet may increase significantly, as shown conceptually by the illustration of thermometer 122.

Figure 2:
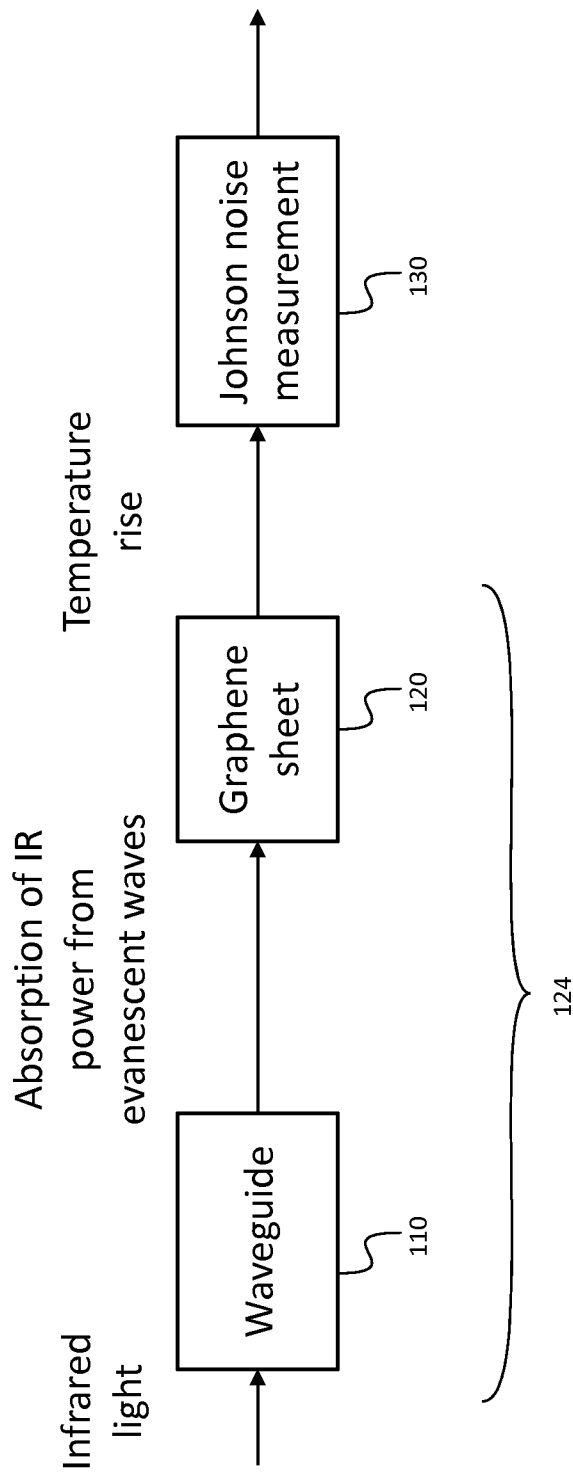
FIG. 2 is a block diagram of an infrared bolometer according to an embodiment of the present invention.

Referring to FIG. 2, in one embodiment, the infrared bolometer includes an infrared waveguide 110 and a graphene sheet 120 forming a bolometer sensor assembly 124, and a thermal noise or "Johnson noise" measuring circuit 130 for monitoring the Johnson noise generated by the graphene sheet 120. When infrared electromagnetic waves propagate in the waveguide 110, evanescent waves outside the waveguide 110 overlap with, and couple to, the graphene sheet 120. This coupling allows power to be absorbed from the electromagnetic waves by the graphene sheet 120, raising the temperature of the graphene sheet 120 to a temperature corresponding to the amount of electromagnetic power absorbed by the graphene sheet 120. The temperature may be measured by measuring the Johnson noise (i.e., the thermal noise) produced by the graphene sheet 120.

When power is absorbed from infrared electromagnetic waves by the graphene sheet 120, the absorption occurs primarily through interaction of the electromagnetic waves with the electronic degrees of freedom of the graphene sheet 120, because the interactions between the electromagnetic waves and the nuclei of the graphene sheet 120 are significantly weaker than the interactions between the electromagnetic waves and the electrons of the graphene sheet 120. Electrons in the graphene sheet 120 are weakly coupled to phonons in the graphene sheet 120, and, in part because of this, the total thermal conductivity corresponding to mechanisms by which the electrons may lose heat (e.g., coupling through the contacts, coupling to the lattice, and coupling to the electromagnetic environment) is relatively small. As a result, the absorption of power from the electromagnetic waves results in a relatively high electron temperature, which in turn results in a relatively high Johnson noise level (i.e., a relatively high thermal noise level) in the potential between any pair of spatially separated points on the graphene sheet 120. The Johnson noise may be measured at two contacts 330, disposed, for example, at two ends of a rectangular graphene sheet 120 (FIG. 3A).

Figure 3A:
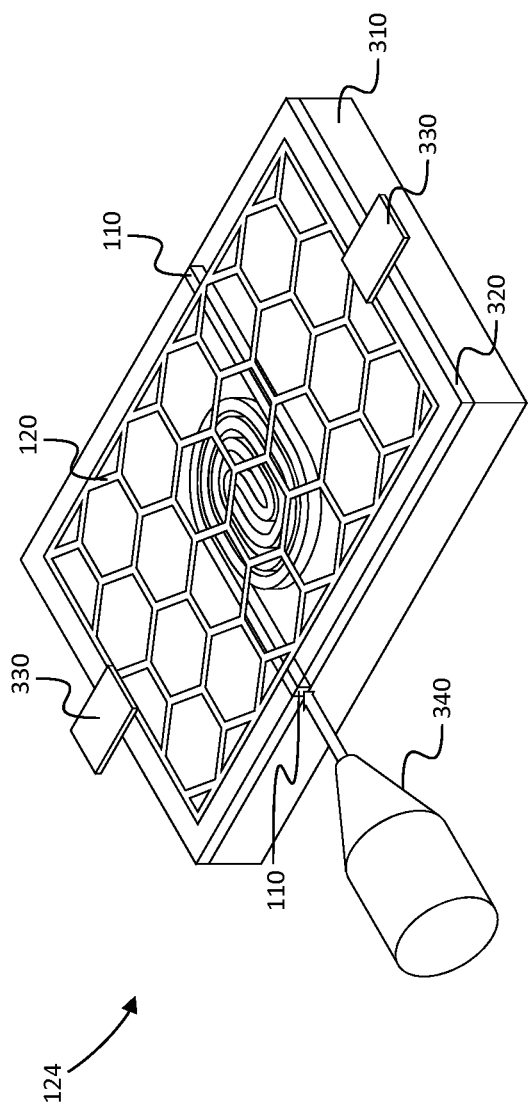
FIG. 3A is a perspective view of a bolometer sensor assembly according to an embodiment of the present invention.

Referring to FIG. 3A, the waveguide 110 and the graphene sheet 120 of the bolometer sensor assembly 124 may be fabricated as an integrated component on a substrate 310. The waveguide 110 may be fabricated by any of various methods known in the art for fabricating a waveguide 110 on the surface of a substrate 310. In one embodiment, a layer of silicon dioxide is formed on a silicon substrate 310, and patterned using photolithography to form the waveguide 110 as a raised structure. A layer 320 of silicon nitride may then be formed over the waveguide 110 and the surrounding area, so that the waveguide 110 core has silicon nitride on both sides of it and above it. This structure may then be polished, so that the upper surface of the structure is flat and smooth. In other embodiments, the waveguide 110 may be formed by depositing a layer of silicon dioxide on a silicon substrate 310, depositing a layer of silicon on the silicon dioxide, and patterning the silicon layer using photolithography to form the core of the waveguide 110 as a raised silicon structure. This structure may then be planarized, i.e., made flat and smooth, by depositing an additional layer of silicon dioxide and polishing it down to the top surface of the raised silicon structure. In other embodiments the waveguide 110 may be composed of another first material, surrounded by one or more other materials having a lower index of refraction than the first material. The resulting waveguide structure may have a thickness of between 50 nm and 2000 nm; in one embodiment it has a thickness of between 100 nm and 1000 nm. The transverse dimensions of the waveguide structure may be somewhat smaller or considerably smaller than the wavelength of the infrared light to be detected. The waveguide 110 may be single-mode or multi-mode when guiding light at the wavelength of the infrared light to be detected. The substrate may be substantially flat, e.g., within 1 micron of being flat over the area including the waveguide, and the waveguide may be formed, e.g., using one of the processes described above, in a layer having a thickness greater than 50 nanometers and less than 2 microns. The front end of the waveguide 110 may extend to the edge of the substrate 310 as shown, and off-chip coupling optics 340 may be used to launch infrared light into the waveguide 110. In other embodiments portions of the coupling optics may be fabricated on the substrate 310. In some embodiments the waveguide 110 is omitted and infrared light propagating in free space illuminates the graphene sheet 120 directly.

The waveguide 110 may be straight, and, to increase the amplitude of the evanescent waves overlapping the graphene sheet 120, it may be part of an optical resonator, constructed, for example, by forming a reflector (e.g., a Bragg reflector) at each end of a section of the waveguide 110. Bragg reflectors may be formed by creating periodic defects in or adjacent to the waveguide 110, e.g., by forming holes in or adjacent the waveguide structure with a focused ion beam. The reflector at the front end of the waveguide 110 (i.e., the end first encountered by the arriving infrared light) may be partially reflective, to allow the infrared light to enter the resonator, and the reflector at the other end (the "back" end) of the waveguide 110 may be highly reflective, to avoid allowing light to escape from the back end of the waveguide 110. In some embodiments only one reflector is used, at the back end of the waveguide 110.

In other embodiments the waveguide 110 may not be straight, but may have one or more curves, increasing the length of the section of waveguide 110 that is adjacent to the graphene sheet 120, and from which evanescent waves may interact with the graphene sheet 120. A curved section in the waveguide may have a radius of curvature less than the length of the graphene sheet, and in the curved section the direction of the waveguide may change by 45 degrees or more. The increased length of the section of waveguide 110 adjacent to the graphene sheet 120 may increase the fraction of the electromagnetic energy launched into the waveguide 110 that is absorbed by the graphene sheet 120. The waveguide 110 may have a double spiral shape as illustrated in FIG. 3A. In other embodiments the waveguide 110 may have the shape of a single spiral, with the back end of the waveguide in the center of the spiral. The back end of the waveguide 110 may be at an edge of the substrate 310 as illustrated in FIG. 3A, or it may be elsewhere on the substrate 310, e.g., near the middle in the case of a waveguide 110 in the shape of a single spiral.

Figure 3B:
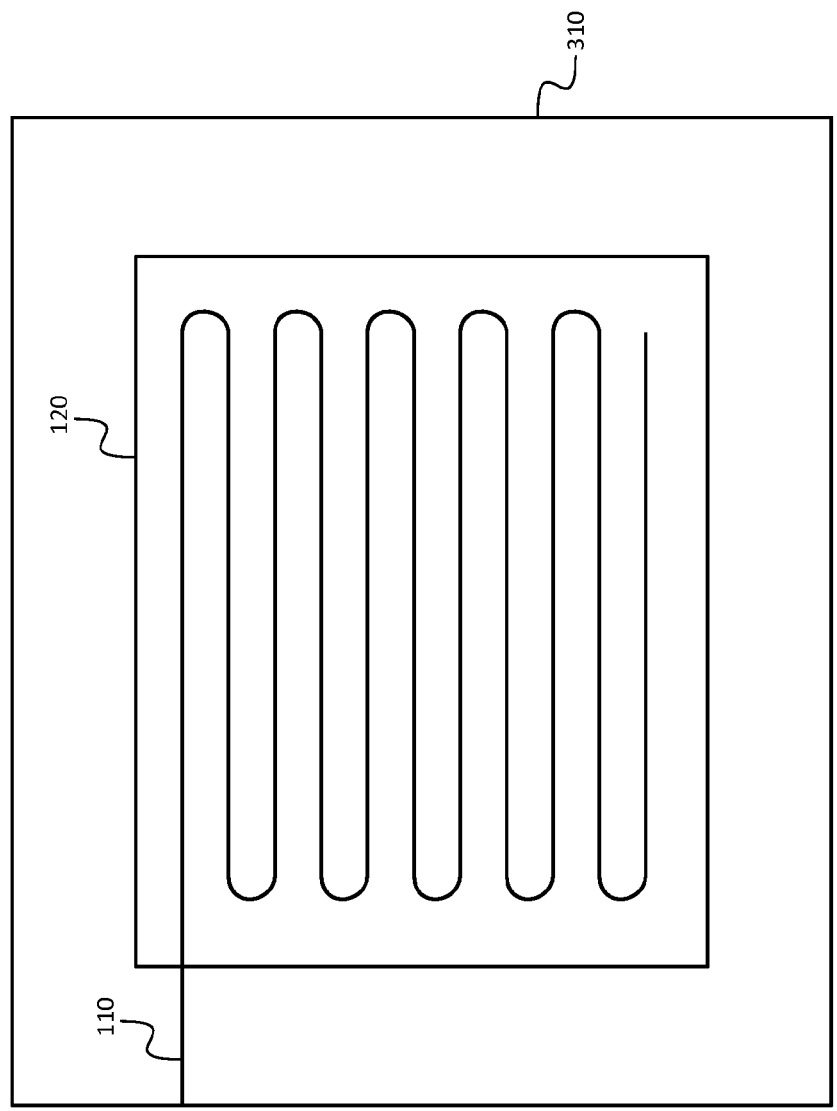
FIG. 3B is a schematic plan view of a bolometer sensor assembly according to an embodiment of the present invention.

Referring to FIG. 3B, in one embodiment the waveguide 110 may have a meandering shape, covering a region that roughly corresponds to the extent of the graphene sheet 120 as illustrated.

In yet other embodiments, the waveguide 110 may have one or more curves and also form part of a resonator, to further increase the fraction of the electromagnetic energy launched into the waveguide 110 that is absorbed by the graphene sheet 120.

Figure 3C:
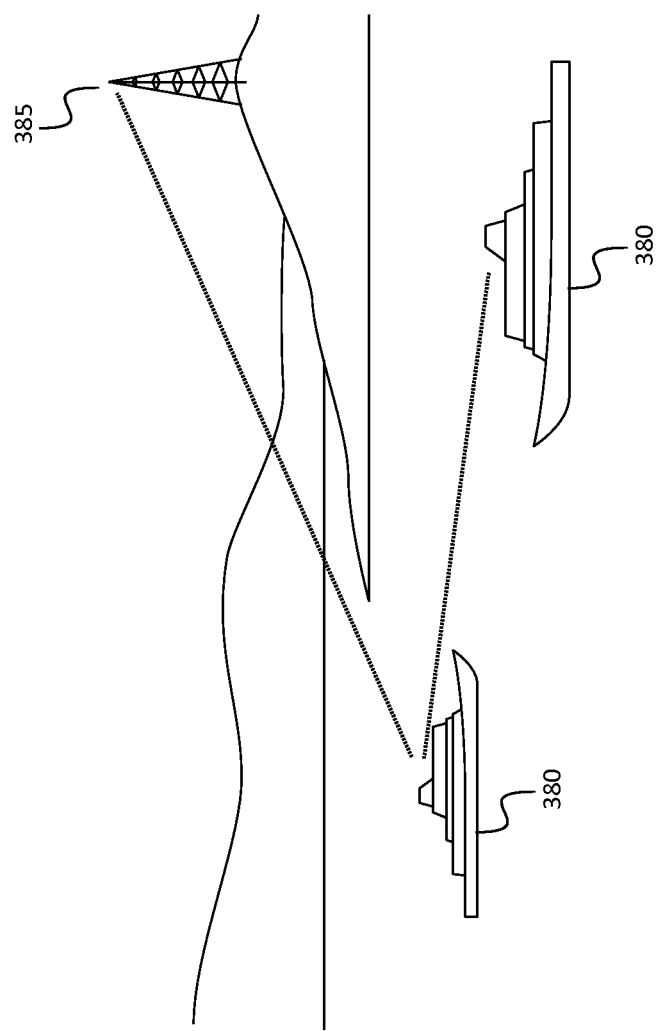
FIG. 3C is a perspective view of a communications system including mobile transceivers according to an embodiment of the present invention.

Infrared light may be launched into the waveguide 110 by any of several systems known to those of skill in the art. For example, referring to FIG. 3C, transceivers using coupling to free-space propagating waves may be used for mobile communications e.g., between ships 380 and a tower 385. In such an application, the infrared light may be coupled into the waveguide 110 using one or more suitable powered optics, such as lenses or curved mirrors. In other communications applications, if the infrared light to be detected is initially propagating in an optical fiber, it may be launched into the waveguide 110 of the bolometer using any suitable one of a variety of fiber-to-chip couplers known to those of skill in the art.

Figure 3D:
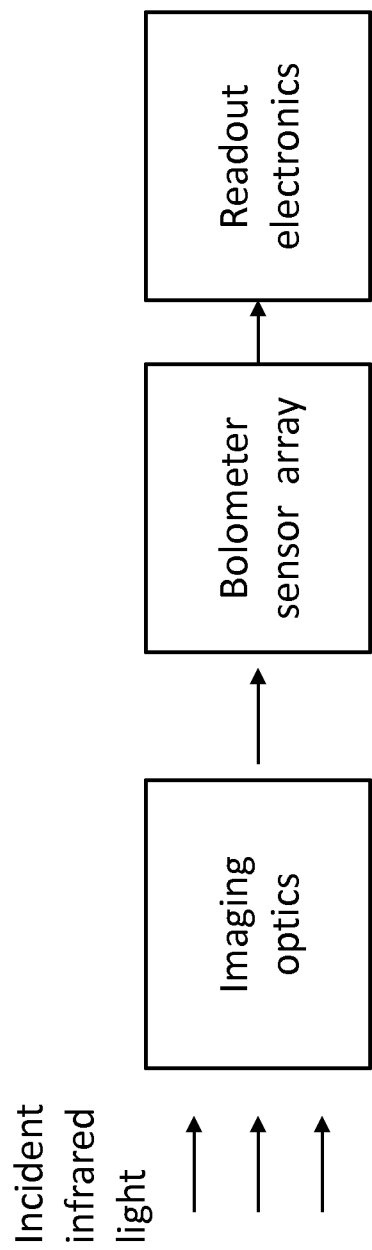
FIG. 3D is a block diagram of an imaging system according to an embodiment of the present invention.

Referring to FIG. 3D, in one embodiment an infrared imaging system may employ an array of bolometer sensor assemblies 124 constructed according to an embodiment of the present invention. Each of the bolometer sensor assemblies 124 has an optical input (e.g., the input of the waveguide 110, or the input of coupling optics 340, or the input of a fiber coupled to the waveguide 110). The optical inputs form an array that is illuminated through imaging optics that project an image onto the array of optical inputs. The array of bolometer sensor assemblies 124 is read out by a set of readout electronics, which may for example be an array of Johnson noise measuring circuits 130. In one embodiment the imaging optics include an array of coupling lenses to couple light into the waveguides 110 of the array of bolometer sensor assemblies 124, or to couple light into a corresponding array of fibers, each of which is coupled to a respective bolometer sensor assembly 124 in the array of bolometer sensor assemblies.

Figure 3E:
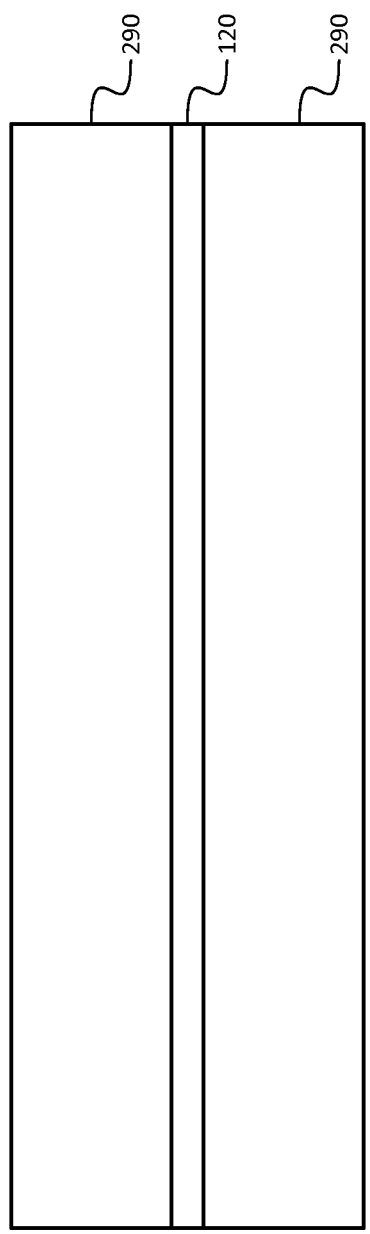
FIG. 3E is a schematic side view of a graphene sheet sandwiched between two layers of hexagonal boron nitride, according to an embodiment of the present invention.

The graphene sheet 120 may be a single-layer sheet, i.e., it may be one atomic layer thick, or it may be a multi-layer graphene sheet 120, having, e.g., 2, 3, 4, or more layers. Referring to FIG. 3E, in one embodiment, the graphene sheet 120 is encapsulated in hexagonal boron nitride (hBN). As is known to those of skill in the art, a sandwich is formed, with the graphene sheet 120 sandwiched between two layers 290 of hexagonal boron nitride. Each layer 290 of hexagonal boron nitride may be between 4 nm and 40 nm thick; these layers 290 of hexagonal boron nitride may keep the surface of the graphene sheet 120 clean, i.e., they may prevent surface contamination from compromising the properties of the graphene sheet 120. The sandwich, composed of the two outer layers 290 of hexagonal boron nitride encapsulating the graphene sheet 120, may then be disposed on the portion of the substrate 310 that includes the waveguide 110.

Each hexagonal boron nitride layer 290 may be a single crystal, with an atomically flat surface facing the graphene sheet 120. Each hexagonal boron nitride layer 290 may be annealed, e.g., at 250° C. for 10-15 minutes, before the sandwich is assembled. The sandwich may be formed by first bringing a first layer 290 of hexagonal boron nitride into contact with the graphene sheet 120, resulting in adhesion of the graphene sheet 120 to the hexagonal boron nitride by van der Waals forces, and then bringing the graphene sheet 120, on the first layer 290 of hexagonal boron nitride, into contact with the second layer 290 of hexagonal boron nitride, resulting in adhesion, again by van der Waals forces, at the interface between the graphene sheet 120 and the second layer 290 of hexagonal boron nitride. The edges of the sandwich may then be etched, e.g. using plasma etching, so that the edges of the two layers 290 of hexagonal boron nitride and the edges of the graphene sheet 120 in the structure remaining after the etch process coincide (i.e., are aligned).

The graphene sheet 120 may be rectangular as illustrated in FIG. 3A, with a length and a width, the length being greater than or equal to the width. The total area of the graphene sheet 120 may be less than 1000 square microns. In one embodiment the graphene sheet 120 is about 10 microns by 10 microns. In one embodiment the graphene sheet 120 has a length in the range 1.0-100.0 microns and a width in the range 1.0-100.0 microns. An electrical contact 330 may be provided at each of two opposing sides or ends of the graphene sheet 120. In one embodiment, contact is made with the edge of the graphene sheet 120, using a layer of metal deposited onto the edge of the sandwich.

For good performance, the graphene sheet 120 may be made as small as possible, kept as clean as possible, and operated at as low a temperature as possible. In one embodiment, the graphene sheet 120 is cooled to 4 K, using, for example, a pulse tube refrigerator or a Gifford-McMahon (GM) cooler. In other embodiments direct cooling with liquid helium, or with liquid helium in a partial vacuum (e.g., using a 1 K pot, to reach temperatures below 4 K) may be used to cool the graphene sheet 120.

The Johnson noise power at the two contacts may be proportional to the electron temperature of the graphene sheet 120. As used herein, the temperature of the graphene sheet 120 refers to the temperature of the electrons in the graphene sheet 120; when infrared electromagnetic power in the evanescent waves of the waveguide 110 is absorbed by the graphene sheet 120, the electron temperature may differ from the phonon temperature.

Figure 4:
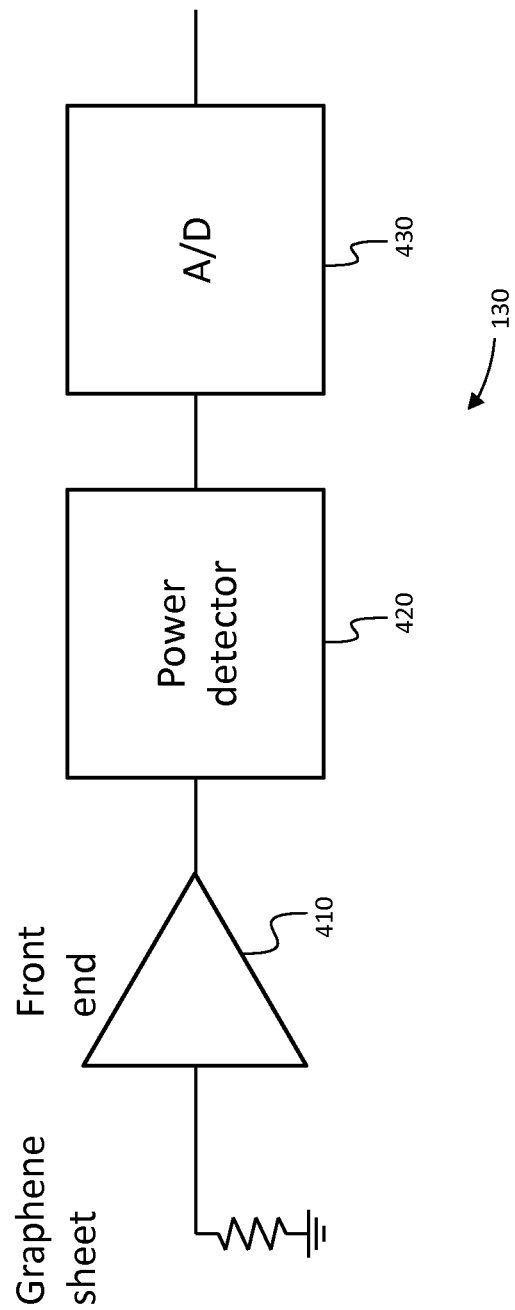
FIG. 4 is a block diagram of a Johnson noise measuring circuit according to an embodiment of the present invention.
Figure 5:
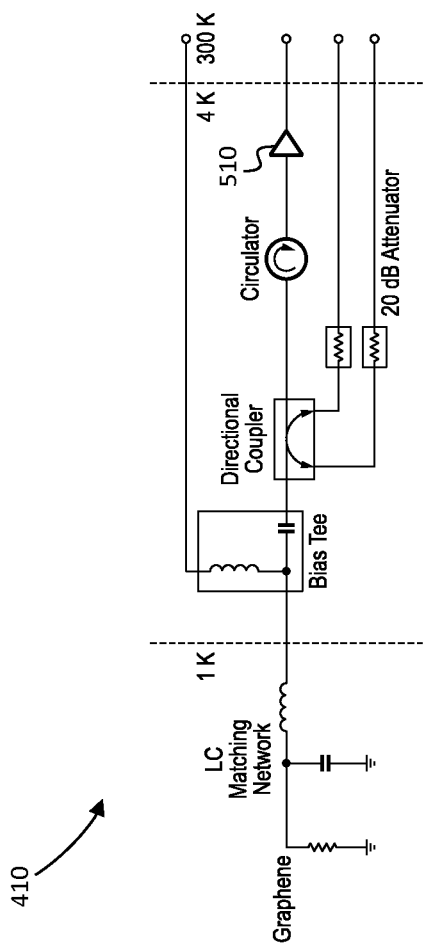
FIG. 5 is a schematic diagram of a front end circuit according to an embodiment of the present invention.

In one embodiment, referring to FIG. 4, a Johnson noise measuring circuit 130 includes a front end circuit 410 for amplifying the Johnson noise and a power detector 420 that converts the noise signal to a power signal or temperature signal having a value (e.g., a voltage) corresponding to (e.g., proportional to) the noise power. Referring to FIG. 5, the front end circuit 410 may include an amplifier 510 that may include a quantum noise limited amplifier followed by a high electron mobility transistor (HEMT) amplifier. The front end circuit 410 may also include a matching network, e.g., an inductor-capacitor (LC) matching network, for transforming the impedance of the graphene sheet 120, which may be about 1,000 ohms, to the input impedance of the amplifier 510 (which may be about 50 ohms). In one embodiment the amplifier 510 has a bandwidth of about 80 MHz around a frequency of about 1.1 GHz, and the matching network is tuned for a frequency of 1.1 GHz. In some embodiments the quantum noise limited amplifier may be a radio frequency superconducting quantum interference device (RF SQUID) amplifier, or it may be a travelling wave parametric amplifier, or a tuned system parametric amplifier (TPA), or any other kind of amplifier with a suitable frequency response that is quantum noise limited or nearly quantum noise limited. In some embodiments the amplifier 510 does not include quantum noise limited amplifier, and has a HEMT amplifier as the first stage instead.

The front end may also include components and connections that may be used for diagnostics, e.g., during manufacturing, operation, or service. A bias tee may be used, for example, to drive a low-frequency current through the graphene sheet 120, modulating its temperature, and the presence of a corresponding modulation at the output of the power detector may then be used to verify the functioning of the device. The differential thermal conductance of the graphene sheet 120 may also be measured in this manner. A directional coupler may be used to supply microwave power to the graphene sheet 120, while monitoring the output of the power detector; this microwave power is essentially entirely absorbed, and this technique may be used to measure the differential thermal conductance as well. A circulator may be used at the input of the amplifier 510 to prevent reflections, backwards-propagating amplifier noise, or signals travelling in reverse through the amplifier 510, from heating the graphene sheet 120.

The power detector of FIG. 4 may be a circuit for producing an output signal proportional to the total power at its input. It may include, for example, a Schottky diode biased (e.g., with a bias tee) so that, in addition to the bias current, it conducts a low-frequency current approximately proportional to the square of the microwave signal applied across its terminals. This low-frequency current may then be measured (e.g., as a change in the bias current). In other embodiments the power detector may be constructed according to another of various power detector circuits known to those of skill in the art. The output of the power detector need not be proportional to the input power, and may, for example, be a nonlinear function of the input power. The output of the Johnson noise measuring circuit 130 may be the (e.g., analog) output of the power detector 420, or a sampling circuit (e.g., an analog to digital (A/D) converter) may be connected between the output of the power detector 420 and the output of the Johnson noise measuring circuit 130, so that the output of the Johnson noise measuring circuit 130 is a digital data stream. In one embodiment the sampling rate of such an A/D converter is about 50 MHz.

Figure 6A:
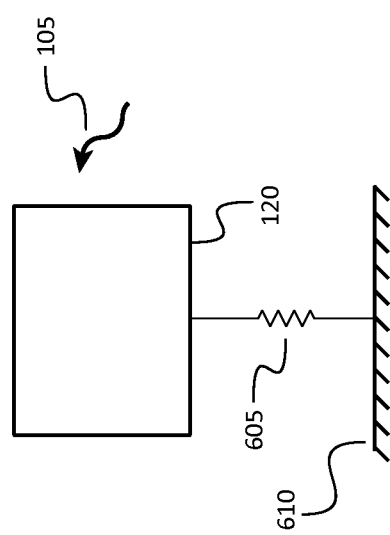
FIG. 6A is a block diagram of a thermal model of a graphene sheet according to an embodiment of the present invention.
Figure 6B:
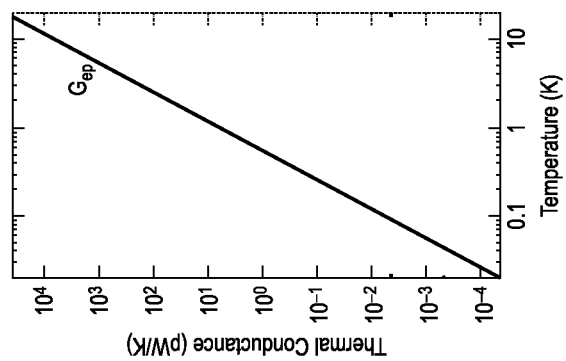
FIG. 6B is a graph of the thermal conductance of a graphene sheet as a function of temperature according to an embodiment of the present invention.

The sensitivity of the bolometer may depend on the size of the graphene sheet 120, its cleanliness, and its temperature. Referring to FIG. 6A, a thermal model for the graphene sheet 120 in the bolometer sensor assembly 124 may include the thermal mass (i.e., the heat capacity) of the graphene sheet 120, the infrared electromagnetic power 105 heating the graphene sheet 120, and a thermal conductance 605 to a thermal reservoir 610. The smaller the heat capacity, the greater the bandwidth of the bolometer sensor assembly 124, and the smaller the thermal conductance 605, the higher the steady-state temperature for a given amount of infrared electromagnetic power 105 heating the graphene sheet 120. Referring to FIG. 6B, in the clean graphene limit, the thermal conductance $G_{ep}$ (between the electrons and the phonons of the graphene sheet 120) may be given by $$G_{ep} = 4\Sigma_c A T^3$$

where T is the temperature, A is the area of the graphene sheet 120, and $\Sigma_c$ is the electron-phonon coupling constant in the clean graphene limit. This coupling constant $\Sigma_c$ is independent of the temperature T and of the area A of the graphene sheet 120, but increases with increasing impurity density level, i.e., with decreasing electron mobility. For disordered graphene, the thermal conductance $G_{ep}$ (between the electrons and the phonons of the graphene sheet 120) may be given by $$G_{ep} = 3\Sigma_d A T^2$$

where $\Sigma_d$ is the electron-phonon coupling constant for disordered graphene.

The graph of FIG. 6B shows the expected thermal conductance $G_{ep}$ for a graphene sheet 120 with an area of 100 square microns (e.g., a 10 micron by 10 micron square graphene sheet 120). The sensitivity of a bolometer using a graphene sheet with the characteristic of FIG. 6B may be estimated by multiplying the thermal conductance by the noise of the amplifier 510 (FIG. 5). For example, for amplifier noise of 1 mK/sqrt (Hz), and for $G_{ep}$=10 pW/K (e.g., from FIG. 6B, for a graphene sheet 120 at 1 K), the expected sensitivity is 10 fW/sqrt (Hz).

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although limited embodiments of a graphene-based infrared bolometer have been specifically described and illustrated herein, many modifications and variations will be apparent to those skilled in the art. Accordingly, it is to be understood that a graphene-based infrared bolometer employed according to principles of this invention may be embodied other than as specifically described herein. The invention is also defined in the following claims, and equivalents thereof.

What is claimed is:

1. An infrared bolometer comprising:
a waveguide having a curved section, the waveguide being configured to guide infrared electromagnetic waves, in a mode having an evanescent field extending outside of the waveguide, the waveguide having a thickness less than a wavelength of the infrared electromagnetic waves;
a graphene sheet having two contacts and configured:
to be coupled to, and to absorb power from, the evanescent field from the curved section;
to have a temperature, when electromagnetic power in the evanescent field is absorbed by the graphene sheet, corresponding to the amount of electromagnetic power absorbed by the graphene sheet; and
to generate thermal noise at the two contacts at a level corresponding to the temperature; and
a circuit connected to the two contacts, the circuit configured to measure the thermal noise level.

2. The bolometer of claim 1, further comprising a refrigerator configured to cool the graphene sheet to a temperature below 4 K.

3. The bolometer of claim 2, wherein the refrigerator is a pulse tube refrigerator.

4. The bolometer of claim 2, wherein the refrigerator is a Gifford-McMahon cooler.

5. The bolometer of claim 1, wherein the graphene sheet substantially has the shape of a rectangle, the rectangle having a length and a width, the length being greater than or equal to the width.

6. The bolometer of claim 5, wherein the length of the rectangle is less than 20 microns.

7. The bolometer of claim 5, wherein the product of the length of the rectangle and the width of the rectangle is less than 1000 square microns.

8. The bolometer of claim 5, wherein the graphene sheet has an electron mobility of more than 100,000 $cm^2/V/s$.

9. The bolometer of claim 5, wherein the waveguide has a curved section, the curved section having a radius of curvature less than the length of the rectangle, the curved section resulting in a change of direction of the waveguide of at least 45 degrees.

10. The bolometer of claim 1, wherein the waveguide comprises a reflector.

11. The bolometer of claim 1 wherein the waveguide is on a substantially flat substrate, in a layer on a surface of the substrate, the layer having a thickness greater than 10 nanometers and less than 2 microns.

12. The bolometer of claim 1, wherein the circuit comprises an amplifier connected to the two contacts.

13. The bolometer of claim 12, further comprising a matching circuit connected between the two contacts and the amplifier.

14. The bolometer of claim 12, further comprising a power detector connected to the amplifier.

15. The bolometer of claim 1, wherein the graphene sheet consists of a single atomic layer of graphene.

16. The bolometer of claim 1, wherein the graphene sheet comprises two atomic layers of graphene.

17. An infrared imaging system comprising:
an array of bolometers, each of the bolometers of the array being a bolometer according to claim 1 and having an optical input, the optical inputs forming an array of optical inputs; and
infrared imaging optics configured to project an image onto the array of optical inputs.

18. The bolometer of claim 1, wherein the curved section has a shape selected from the group consisting of single spirals, double spirals, and meandering shapes.

19. An infrared bolometer comprising:
- a waveguide configured to guide infrared electromagnetic waves, in a mode having an evanescent field extending outside of the waveguide;
- a graphene sheet having two contacts and configured:
  - to be coupled to the evanescent field;
  - to have a temperature, when electromagnetic power in the evanescent field is absorbed by the graphene sheet, corresponding to the amount of electromagnetic power absorbed by the graphene sheet; and
  - to generate thermal noise at the two contacts at a level corresponding to the temperature; and
- a circuit connected to the two contacts, the circuit configured to measure the thermal noise level; and
- a first layer of hexagonal boron nitride immediately adjacent to a first surface of the graphene sheet, and a second layer of hexagonal boron nitride immediately adjacent to a second surface of the graphene sheet.

20. The bolometer of claim 19, wherein each of the first layer of hexagonal boron nitride and the second layer of hexagonal boron nitride has a thickness greater than 4 nm and less that 40 nm.

* * * * *